(12) United States Patent
Luscher et al.

(10) Patent No.: US 6,589,361 B2
(45) Date of Patent: Jul. 8, 2003

(54) CONFIGURABLE SINGLE SUBSTRATE WET-DRY INTEGRATED CLUSTER CLEANER

(75) Inventors: Paul E Luscher, Sunnyvale, CA (US); James D Carducci, Sunnyvale, CA (US); Siamak Salimian, Sunnyvale, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/882,132

(22) Filed: Jun. 15, 2001

(65) Prior Publication Data

US 2002/0062848 A1 May 30, 2002

Related U.S. Application Data

(60) Provisional application No. 60/212,127, filed on Jun. 16, 2000.

(51) Int. Cl.$^7$ ................................................. B08B 7/00
(52) U.S. Cl. ........................... 134/33; 134/1.3; 134/32; 134/34; 134/902; 134/198; 134/200; 134/199; 156/345.55; 438/906
(58) Field of Search ........................ 134/1.3, 32, 33, 134/34, 902, 198, 199, 200; 156/345.55; 438/906

(56) References Cited

U.S. PATENT DOCUMENTS

| | | | |
|---|---|---|---|
| 3,597,289 A | 8/1971 | Kohl et al. ................. 156/17 |
| 4,557,785 A | 12/1985 | Ohkuma ..................... 156/345 |
| 4,571,850 A | 2/1986 | Hunt et al. .................. 34/242 |
| 4,781,764 A | 11/1988 | Leenaars .................... 134/34 |
| 4,788,992 A | 12/1988 | Swainbank et al. ........ 134/64 R |
| 4,984,597 A | 1/1991 | McConnell et al. ........ 134/95 |
| 5,055,138 A | 10/1991 | Slinn ........................ 134/11 |
| 5,090,432 A | 2/1992 | Bran ......................... 134/139 |
| 5,094,013 A | 3/1992 | Martin et al. .............. 34/62 |
| 5,183,067 A | 2/1993 | Slinn ......................... 134/61 |
| 5,243,768 A | 9/1993 | Fukao et al. ............... 34/22 |
| 5,286,657 A | 2/1994 | Bran .......................... 437/9 |
| 5,333,628 A | 8/1994 | Ogata et al. ............... 134/64 R |
| 5,335,681 A | 8/1994 | Schmid ...................... 134/64 R |
| 5,339,842 A | 8/1994 | Bok ............................ 134/1 |
| 5,351,419 A | 10/1994 | Franka et al. .............. 34/470 |

(List continued on next page.)

FOREIGN PATENT DOCUMENTS

| | | | |
|---|---|---|---|
| GB | 2 176 908 | 10/1985 | ......... H01L/21/465 |
| GB | 2 185 444 | 8/1986 | ............. B08B/3/04 |
| GB | 2 183 552 | 10/1986 | ......... H01L/21/465 |
| WO | WO98/1890 | 1/1998 | ............ H01L/21/00 |

OTHER PUBLICATIONS

PCT Search Report dated Jan. 15, 2003 for PCT/US02/30854.

*Primary Examiner*—Randy Gulakowski
*Assistant Examiner*—M. Kornakov
(74) *Attorney, Agent, or Firm*—Moser, Patterson & Sheridan; Joseph Bach

(57) ABSTRACT

The present invention provides a method and an apparatus for cleaning substrates. The cleaning chamber defines a processing cavity adapted to accommodate a substrate therein. In one embodiment, the cleaning chamber includes an upper plate, a lower plate and a gas manifold disposed there between. A substrate is disposed in the processing cavity without contacting other chamber components by a Bernoulli effect and/or by a fluid cushion above and/or below the substrate. Fluid is flowed into the processing cavity at an angle relative to a radial line of the substrate to induce rotation of the substrate during a cleaning and drying process. A cleaning process involves flowing one or more fluids onto a surface of the substrate during its rotation. One-sided and two-sided cleaning and drying is provided.

56 Claims, 12 Drawing Sheets

U.S. PATENT DOCUMENTS

| | | | |
|---|---|---|---|
| 5,365,960 A | 11/1994 | Bran | 134/184 |
| 5,371,950 A | 12/1994 | Schumacher | 34/78 |
| 5,437,733 A | 8/1995 | Okumura | 134/34 |
| 5,520,744 A | 5/1996 | Fujikawa et al. | 134/11 |
| 5,539,995 A | 7/1996 | Bran | 34/77 |
| 5,542,441 A | 8/1996 | Mohindra et al. | 134/95.2 |
| 5,556,479 A | 9/1996 | Bran | 134/1.3 |
| 5,571,337 A | 11/1996 | Mohindra et al. | 134/25.4 |
| 5,634,978 A | 6/1997 | Mohindra et al. | 134/2 |
| 5,651,379 A | 7/1997 | Mohindra et al. | 134/95.2 |
| 5,656,097 A | 8/1997 | Olesen et al. | 134/1 |
| 5,660,642 A | 8/1997 | Britten | 134/30 |
| 5,685,327 A | 11/1997 | Mohindra et al. | 134/95.2 |
| 5,772,784 A | 6/1998 | Mohindra et al. | 134/21 |
| 5,778,554 A | 7/1998 | Jones | 34/58 |
| 5,868,150 A | 2/1999 | Mohindra et al. | 134/135 |
| 5,873,947 A | 2/1999 | Mohindra et al. | 134/18 |
| 5,878,760 A | 3/1999 | Mohindra et al. | 134/95.2 |
| 5,891,256 A | 4/1999 | Mohindra et al. | 134/2 |
| 5,899,216 A * | 5/1999 | Goudie et al. | 134/61 |
| 5,908,509 A | 6/1999 | Olesen et al. | 134/1.3 |
| 5,950,645 A | 9/1999 | Olesen et al. | 134/98.1 |
| 5,979,475 A | 11/1999 | Satoh et al. | 134/140 |
| 5,996,595 A | 12/1999 | Olesen et al. | 134/1.3 |
| 6,059,893 A | 5/2000 | Kawasaki | 134/37 |

* cited by examiner

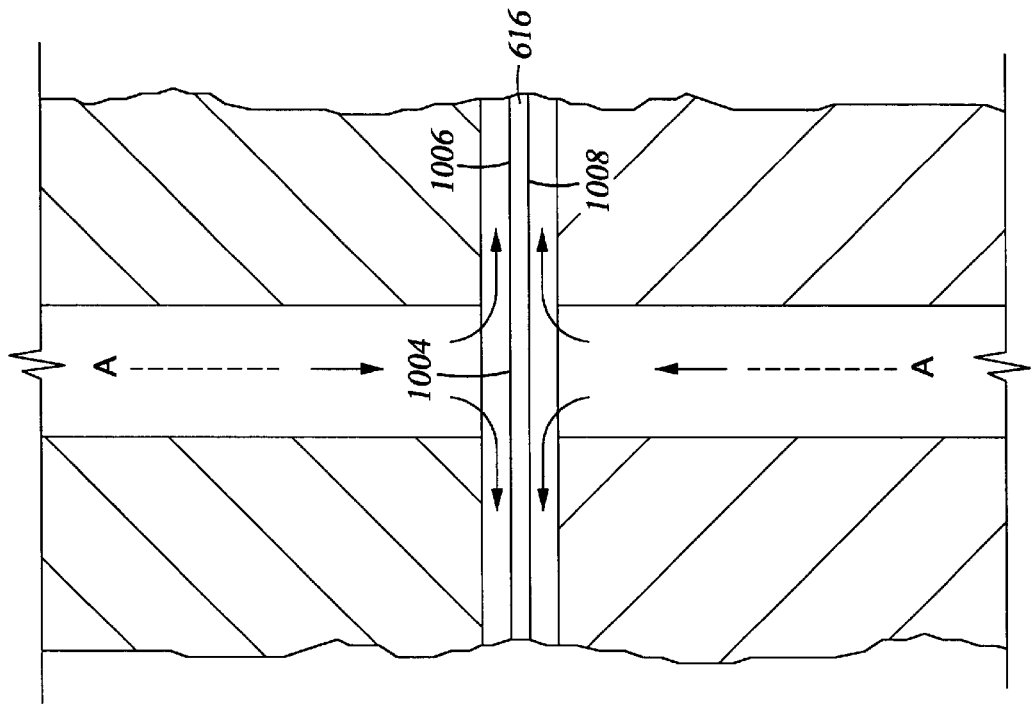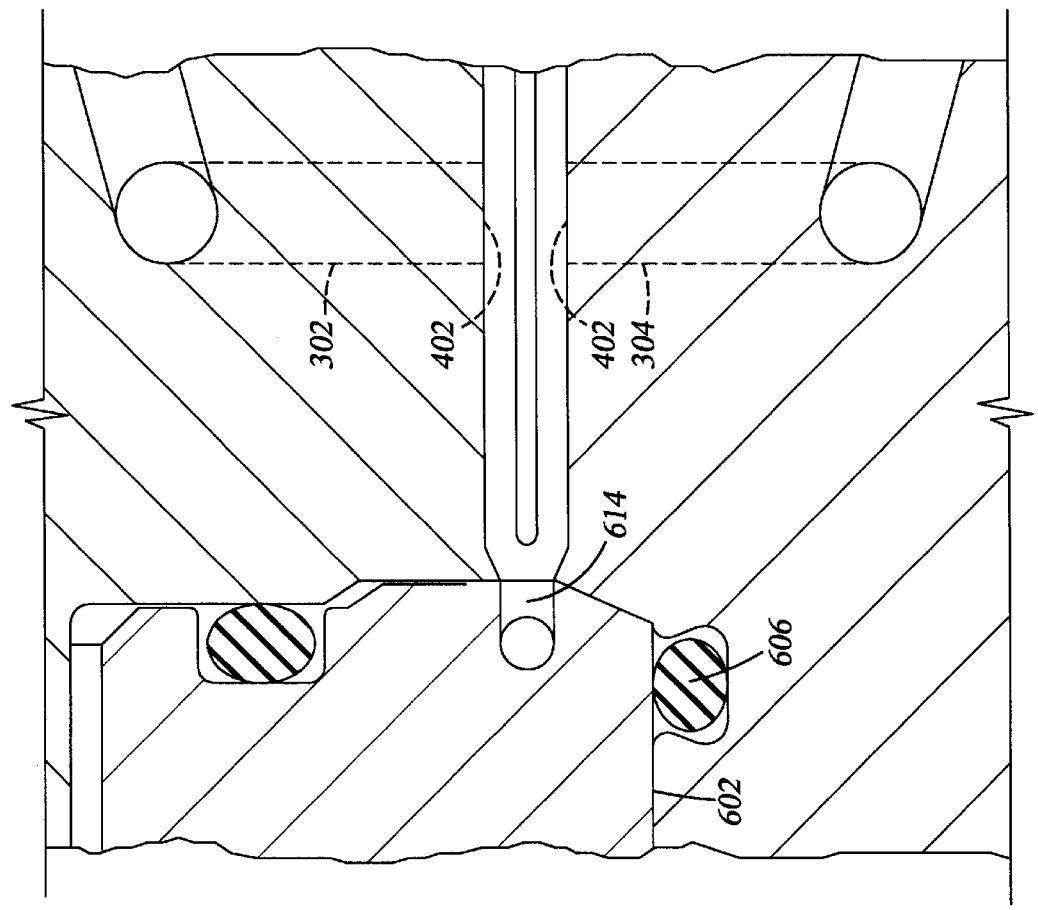
Fig. 10

CONFIGURABLE SINGLE SUBSTRATE WET-DRY INTEGRATED CLUSTER CLEANER

CROSS-REFERENCE TO RELATED APPLICATIONS

This application claims benefit of U.S. provisional patent application serial No. 60/212,127, filed Jun. 16, 2000, which is hereby incorporated by reference.

BACKGROUND OF THE INVENTION

1. Field of the Invention

The present invention relates to semiconductor processing, and more particularly, to a substrate cleaning apparatus and method.

2. Background of the Related Art

The manufacture of semiconductor components includes many processes and steps. Typical processes include chemical vapor deposition, physical vapor deposition, etching, ion implementation, epitaxial growth, and the like. During one or more of the processes performed in the manufacture of semiconductor devices, the substrate on which the devices are disposed must be cleaned. Cleaning is generally necessary to remove residue which may have accumulated on the devices in previous manufacture steps, which may damage the devices.

One conventional cleaning method involves dipping a substrate, or more commonly a rack of substrates, in an aqueous solution to remove residue from the surface of the substrate. The cleaning solutions are often contained in tanks open to the atmosphere. As a result, airborne particles can enter into the process solutions. Through surface tension, these particles are easily transferred to the substrate surfaces as the substrates are dipped and lifted out of the tanks.

Another example of a conventional technique is known as a cascade rinse. A cascade rinse utilizes a cascade rinser, which includes inner and outer chambers separated by a partition. Rinse water flows from a water source into the inner chamber and then to the outer chamber. A substrate is cleaned by passing the substrate through the rinse water of the inner chamber. This process is often used to neutralize and remove acid from an etched substrate.

One problem with the cascade rinser is that "dirty water" often exists in the inner chamber. The dirty water typically includes residual acid as well as particles that often attach to the substrate. These particles can cause defects in the devices of the substrate, thereby reducing the number of usable dyes on a typical substrate.

Subsequent to a fluid cleaning process, the substrates generally must be dried. Thus, in addition to being ineffective cleaning methods, the foregoing cleaning techniques also suffer from the fact that the substrate must generally be moved to another location to undergo the drying process. Transferring substrates between environments is undesirable, as the potential for contamination increases with each transfer.

As a result of the shortcomings of the processes described above, techniques have been developed to both rinse and dry substrates at one location. One such technique, known as spin-rinse-dry, uses a combination of rinse water to rinse the substrate and high speed rotation to remove the cleaning fluid from the substrate. During the rotation of the substrate, one or more fluids are delivered on the substrate's surface and allowed to flow outwardly over the substrate as a result of the rotation. The fluids may include chemicals such as a dissolving fluid to react with material in the substrate and water to flush the dissolved material from the substrate's surface. Drying the substrate is accomplished by continuing to rotate the substrate after terminating the fluid flow. The fluid is removed from the substrate during the dry step as a result of the centrifugal force exerted on the fluid as a result of the rotation and the evaporation of the fluid.

One problem with spin-rinse-dry techniques is the generation of particles during the process cycle. The particles are generated because of the need to chuck the substrate against a support member. Typically, a substrate is positioned on the support member and then chucked thereto by applying a backside pressure. Additionally or alternatively, clamping members disposed at a perimeter portion of the substrate may provide a sufficient force to secure the substrate during the process cycle. In any case, contact between the substrate and mechanical components such as the support member and/or clamping mechanisms, often generate particulates which can contaminate the devices.

As the feature sizes of integrated circuits become smaller, the problems associated with particulates worsen. As a result, current methods and apparatus are not well suited for the next generation of integrated circuits.

Therefore, there is a need for an apparatus and method to clean and dry a substrate.

SUMMARY OF THE INVENTION

The invention provides a method and apparatus for cleaning and/or drying a substrate. In a first aspect of the invention, a substrate cleaning chamber is provided comprising a chamber body defining a processing cavity adapted to accommodate a substrate, inlets formed in the chamber body and in fluid communication with the processing cavity, and evacuation ports disposed about the processing cavity at a radial distance from a center axis of the processing cavity.

In another aspect of the invention, the substrate cleaning chamber further comprises a plurality of propulsion channels terminating on upper and lower surfaces of the processing cavity. A fluid delivery system may be coupled to the fluid inlets and to the plurality of propulsion channels.

In yet another aspect of the invention, a processing system comprises a transfer chamber at least one substrate cleaning chamber. In one embodiment the substrate cleaning chamber comprises a chamber body defining a processing cavity adapted to accommodate a substrate and further defining an opening to accommodate transfer of a substrate from the transfer chamber into the processing cavity. At least one fluid inlet is formed in the chamber body and in fluid communication with the processing cavity. One or more gas ejection ports are disposed about the processing cavity at a radial distance from a center axis of the processing cavity and oriented at an angle relative to a radial line originating at the center axis.

In still another aspect of the invention, a method for cleaning a substrate is provided, the method comprising providing a chamber body having a cavity at least partially defined by an upper surface and lower surface, positioning a substrate in the cavity, flowing a first fluid into the cavity and onto the substrate, and flowing a second fluid onto the substrate at an angle to cause rotation of the substrate about a center axis.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 10 is a partial sectional view of a chamber illustrating the flow patterns of fluid through inlets and in a processing cavity.

DETAILED DESCRIPTION OF THE PREFERRED EMBODIMENT

The invention generally provides an apparatus and method for cleaning and drying the substrate. In one aspect, a processing system includes a loading station, a transfer chamber and at least one cleaning station accessible from the transfer chamber. One or more robots disposed in or near the processing system facilitate transfer of the substrates therethrough.

In one embodiment, a cleaning chamber includes an upper plate and a lower plate which define a processing cavity. Primary fluid delivery channels are formed in a central portion of the upper plate and lower plate and terminate at lower and upper surfaces of the plates, respectively. Auxiliary fluid delivery channels extend angularly outward from the central portion of the plates to the lower and upper surfaces. The auxiliary fluid delivery channels, which may be termed propulsion channels, are coupled to deflection recesses formed in the lower and upper surfaces of the upper and lower plates, respectively. A fluid supply unit is coupled to the primary and auxiliary fluid delivery channels. In operation, fluids are delivered from the fluid supply unit to the processing cavity via the primary and auxiliary fluid delivery channels. Fluid is flowed from the auxiliary fluid delivery channels to the deflection recesses to provide an angular fluid flow pattern at the surface of a substrate being processed, thereby causing the substrate to rotate. In one embodiment, a drying agent is flowed through the primary and auxiliary fluid delivery channels to dry the substrate after a cleaning process.

In one embodiment, an annular exhaust manifold is mounted to the upper plate. The manifold includes ports which are fluidly coupled to an exhaust system including a pump. The ports are oriented at an angle relative to a radial line originating at a center axis of the cavity. Accordingly, fluid being drawn into the ports provides an angular flow pattern proximate to the substrate, thereby rotating the substrate.

Figure 1:
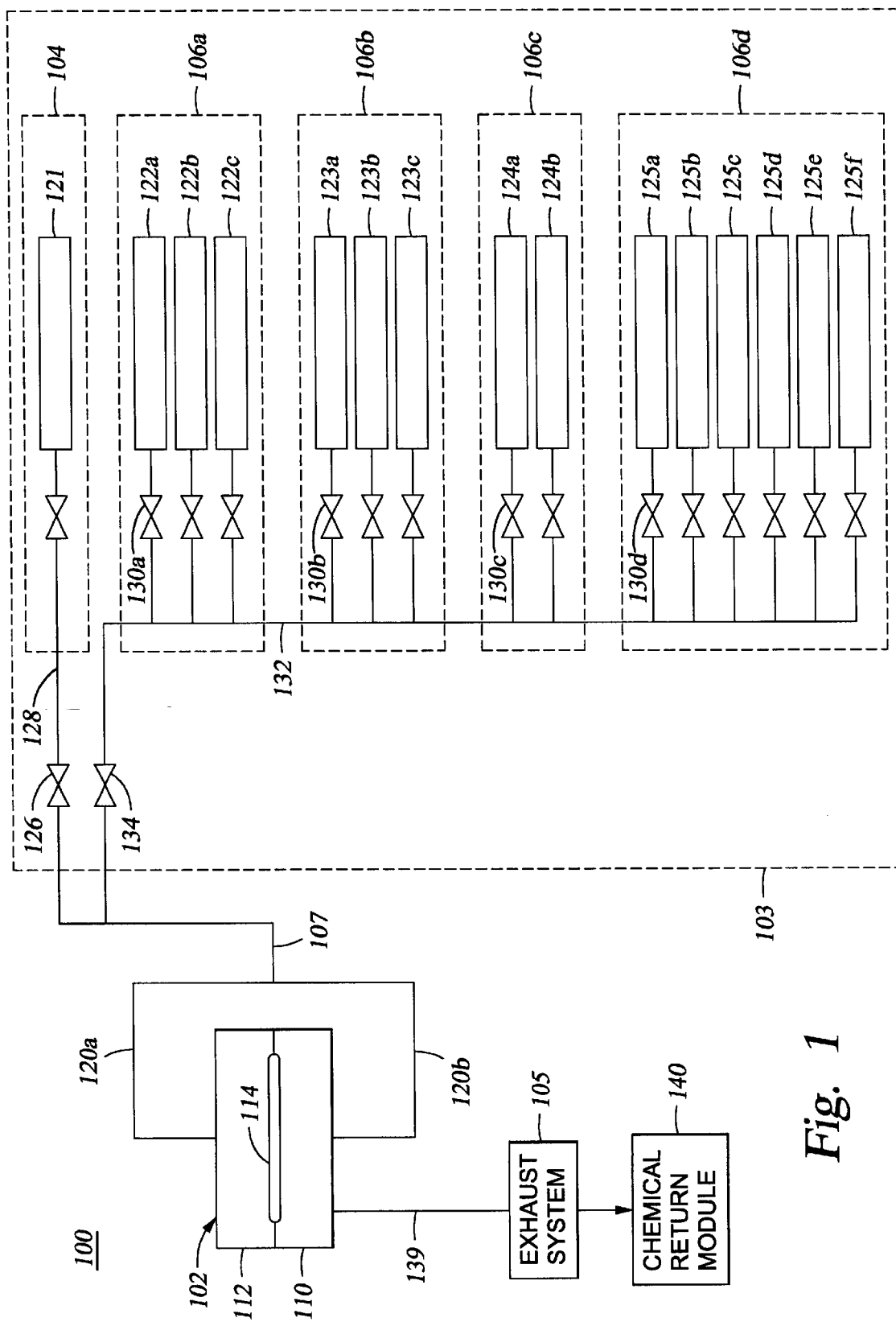
FIG. 1 is a cross section of a cleaning chamber showing an upper plate and a lower plate in a substrate loading/unloading position.

FIG. 1 shows a schematic diagram of a processing system 100. The processing system 100 generally includes a cleaning chamber 102, a fluid supply unit 103 and an exhaust system 105. The cleaning chamber 102 includes a lower plate 110 and an upper plate 112 defining processing cavity 114 therebetween. A supply line 107, having a pair of inlet lines 120a–b coupled to the cleaning chamber 102, is connected at one end to the fluid supply unit 103, thereby allowing fluid flow from the fluid delivery unit 103 to the cleaning chamber 102. In one embodiment, a first inlet line 120a is coupled to the upper plate 112 while a second inlet line 120b is coupled to the lower plate 110.

The fluid supply unit 103 includes a drying fluid module 104 and a plurality of cleaning fluid modules 106a–d. The drying fluid module 104 preferably includes at least one container 121 containing a carrier gas, such as $N_2$, and a drying agent such as isopropyl alcohol (IPA). Fluid flow from the drying fluid module to the cleaning chamber 102 is controlled by a valve 126 disposed in a fluid delivery line 128 which is connected to the supply line 107.

The cleaning fluids in the cleaning fluid modules 106a–d are selected according to particular processes. In the embodiment shown in FIG. 1, each of the cleaning fluid modules 106a–d includes at least one container 122–125 that supplies a fluid or mixture of fluids to the cleaning chamber 102. In one embodiment, the first cleaning fluid module 106a contains fluids used during post silicon etch processes, the second module 106b contains fluids used during post metal and oxide etch processes, the third module 106c contains fluids used during post implant processes and the fourth module 106d contains fluid used during pre-thermal processes. Illustrative fluids of the first module 106a include a combination of $H_2SO_4$, $O_3$ and deionized (DI) water in a first container 122a, dilute hydrofluoric acid (DHF) in a second container 122b and DI water in a third container 122c. Illustrative fluids of the second module 106b include ECK 600 in a first container 123a, EKC 4000 in a second container 123b and DI water in a third container 123c. Illustrative fluids of the third module 106c include a combination of $H_2SO_4$, $O_3$ and deionized (DI) water in a first container 124a and DI water in a second container 24b. Illustrative fluids of the fourth module 106d include a combination of $H_2SO_4$ and $H_2O_2$ in a first container 125a, a combination of $NH_4OH$, $H_2O_2$ and DI water in a second container 125b, HCL, $H_2O_2$ and DI water in a third container 125c, DHF in a fourth container 125d, hot DI water in a fifth container 125e and DI water in a sixth container 125f.

Fluid flow from the individual containers 122–125 into a fluid delivery line 132 is controlled by valves 130a–d. Additionally, the flow of fluids from the fluid delivery line 132 into the inlet lines 120a–b is controlled by a valve 134.

Fluid flow from the cleaning chamber 102 is achieved by employing the exhaust system 105. The exhaust system 105 is coupled to the cleaning chamber 102 by one or more exhaust lines 139. The exhaust system preferably includes one or more pumps and valves adapted to provide a pressure gradient between the chamber 102 and the exhaust system 105.

In one embodiment, the processing system 100 includes a chemical return module 140. The chemical return module 140 is adapted to collect fluids expelled from the cleaning chamber 102 and process them according to the fluid type. Illustratively, the chemical return module 140 may include an IPA recycle unit, a waste treatment unit, a DI reclaim unit and a solvent reclaim unit. Such an embodiment economizes the cost of operation of the processing system 100.

Figure 2:
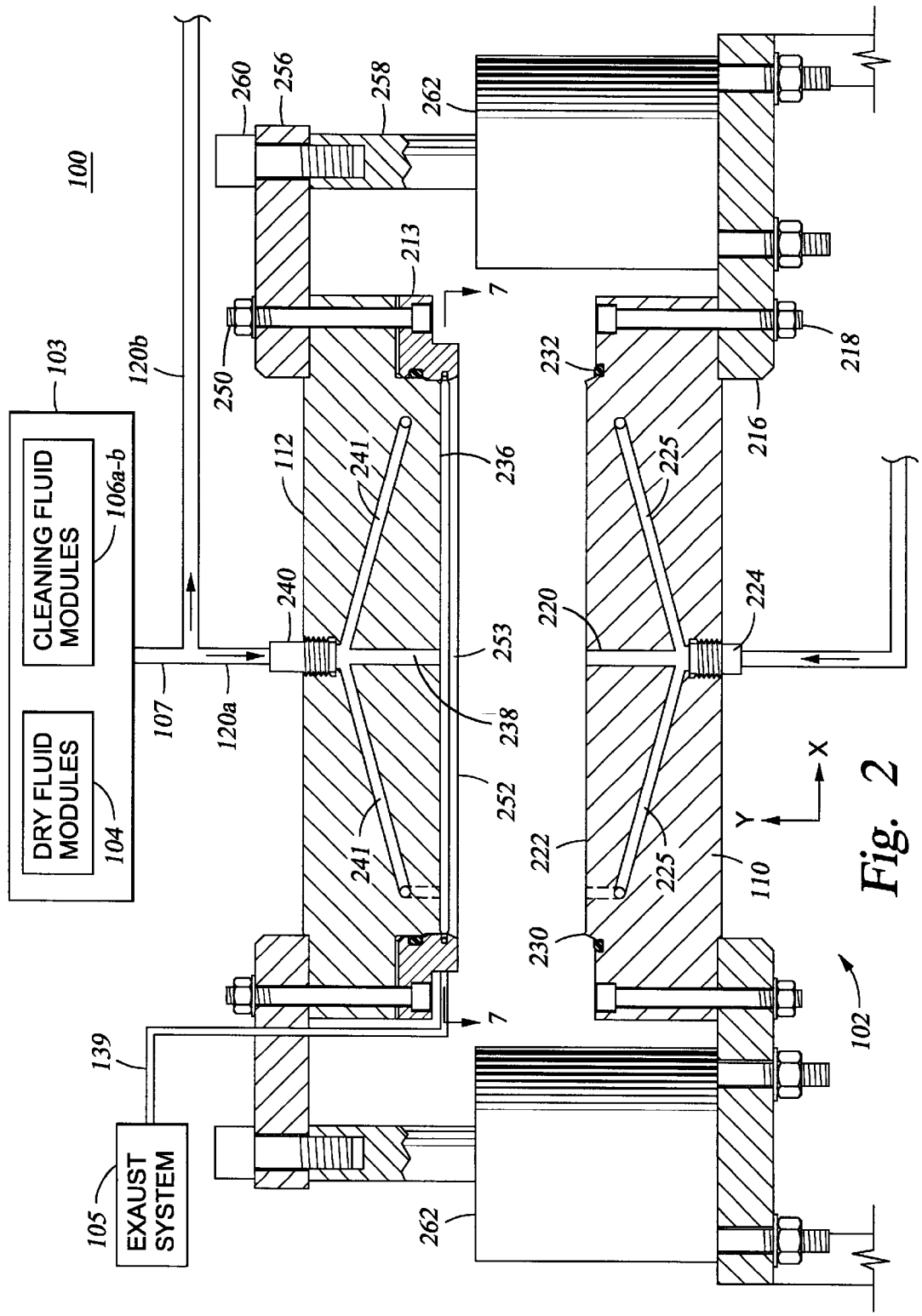
FIG. 2 is a cross section of a cleaning chamber showing an upper plate and lower plate in substrate processing position.

FIG. 2 shows a cross section of a cleaning chamber 102. The chamber 102 typically includes an upper plate 112, a lower plate 110 and a manifold 213. In one embodiment, the upper plate 112 and lower plate 110 are each made of a material selected to minimize the potential for particle generation. Illustratively, the plates 110, 112 may be manufactured of Teflon. Although shown in FIG. 2 as substantially monolithic, i.e., being formed of a single piece of material, the plates 110, 112 may be formed of any number of components.

The lower plate 110 is disposed on a base 216 and secured thereto by fasteners 218. Fasteners 218 may be any mechanism adapted to rigidly secure the lower plate 110 to the base 216. In the embodiment of FIG. 2, the fasteners 218 are a combination of bolts and nuts. The lower plate 110 is a generally annular member having a lower surface 222 circumscribed by a lip 230. The lower surface 222 is a substantially planer surface that may be highly polished in order to minimize the turbulence of gas flowing over the lower surface 222. A seal 232, such as an elastomeric member, is disposed outwardly of the lip 230. During operation, the seal 232 is preferably disposed against a surface of the manifold 213 in the manner described below to seal the processing cavity 114 (shown in FIG. 1).

A lower primary fluid delivery channel 220 (hereinafter referred to as the "lower primary channel 220") is formed in the lower plate 110. The lower primary channel 220 extends vertically through the lower plate 110 and terminates at a lower surface 222. One end of the lower primary channel 220 is diametrically enlarged to accommodate coupling 224. The coupling 224 provides a connection mechanism for the inlet line 120b. Accordingly, fluid can be supplied from the fluid supply unit 103 to the lower surface 222.

Auxiliary fluid delivery channels 225 (hereinafter referred to as the "auxiliary channels 225") extend through the lower plate 110 from the coupling 224 to the lower surface 222. The auxiliary channels 225 are angled to extend radially outwardly from the coupling 224 by some degree. Accordingly, the auxiliary channels are separated from the lower primary channel 220 by an increasing radius as the auxiliary channels 225 near the lower surface 222.

The upper plate 112 is shown disposed above the lower plate and substantially parallel therewith. The upper plate 112 is stabilized by a bracket 256 and a shaft 258. The bracket 256 may be secured to the upper plate 112 by fastener 250 and to the shaft 258 by fastener 260. The shafts 258 are connected to actuators 262 which are secured to the base 216. The actuators 262 may be any device adapted to move the shafts 258 along a vertical axis. Accordingly, the actuators 262 and shafts 258 ensure that the plates 110, 112 are fixedly ridged along a horizontal axis (X) while providing relative movement between the plates 110, 112 along the vertical axis (Y).

In one embodiment the cleaning chamber 102 is substantially symmetrical so that the upper plate 112 is constructed similarly to the lower plate 110. Accordingly, the upper plate 112 is a generally annular member having an upper primary fluid delivery channel 238 (hereinafter upper primary channel 238) formed at a central portion of the upper plate 112. One end of the upper primary channel 238 is diametrically enlarged to accommodate a coupler 240 while another end of the upper primary channel 238 terminates at an upper surface 236 of the upper plate 112. The coupler 240 provides an attachment mechanism for the inlet line 120a, thereby connecting the fluid supply unit 103 with the upper plate 112.

Upper auxiliary fluid delivery channels 241 (hereinafter also referred to as "upper auxiliary channels 241") are formed in the upper plate 112 and extend toward the upper surface 236. Additionally, upper auxiliary channels 241 are oriented to extend radially outwardly by some degree relative to the upper primary channel 238 in a manner similar to the lower auxiliary channels 225 relative to the lower primary channel 220.

As with the lower surface 222, the upper surface 236 is preferably a highly polished surface to ensure substantially laminar flow of a fluid over the surface 236. The upper surface 236 is delimited by the manifold 213 disposed at a diameter substantially equal to the lip 230 of the lower plate 110.

Figure 3A:
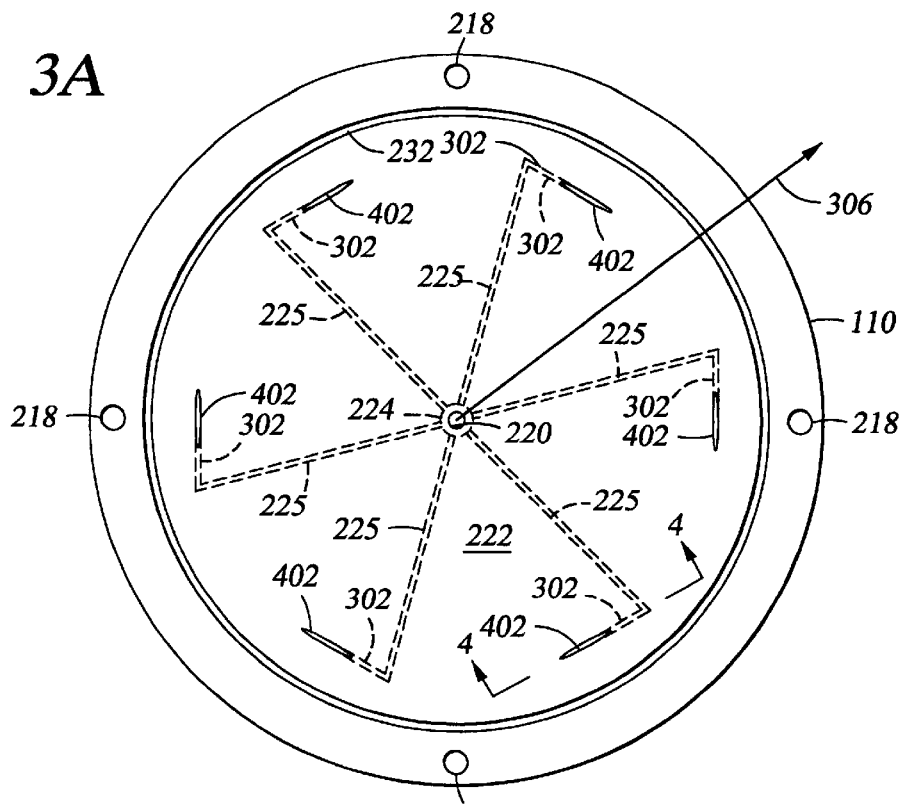
FIG. 3 is a partial cross sectional view of a cleaning chamber including a manifold.
Figure 3B:
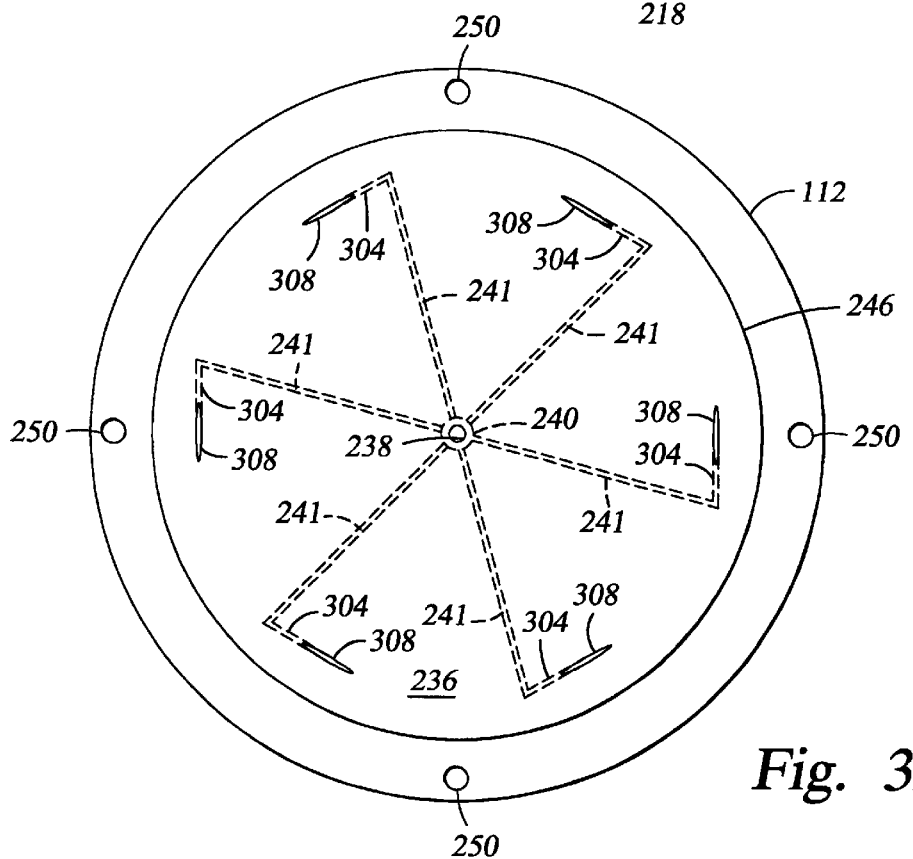

In one embodiment, the plates 110, 112 are substantially symmetric and may be described with reference to FIGS. 3A–B. FIGS. 3A–B show a plan view of plates 110, 112 respectively illustrating the primary channels 220, 238 and the auxiliary channels 225, 241. The primary channels 220, 238 is centrally disposed in the plates 110, 112 respectively while the auxiliary channels 225, 241 extend radially outwardly therefrom. Although six auxiliary channels 225, 241 are shown in FIGS. 3A–B, it is understood that any number of channels is contemplated.

Figure 4:
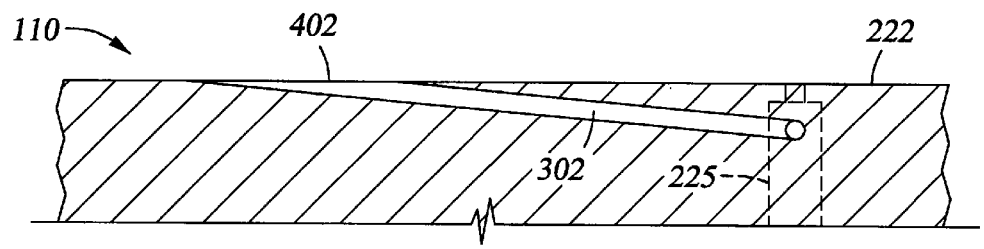
FIG. 4 is a top view of a manifold.

At an outlet ends 302, 304 proximate the surfaces 222, 236, the auxiliary channels 225, 241 bend sharply. One embodiment of the auxiliary channel 225 and the outlet end 302 taken along section lines 4—4 of FIG. 3A, is shown in FIG. 4. The outlet end 302 has a slight upward inclination and couples to a deflection recess 402 formed in the lower surface 222. The deflection recess 402 is tapered upwardly so that the portion nearest the outlet end 302, 304 is relatively deeper than the terminal end of the deflection recess 402. In one embodiment, the outlet end 302, 304 and the deflection recess 402 are oriented at between about 20 degrees and about 160 degrees relative to a radial line 306 (shown in FIG. 3) originating at a center of the plate 110, 112. The outlet end 304 and a deflection recess 308 of the upper plate 112 may be similarly constructed. However, while the outlet end 302 and deflection recesses 402 of the plate 110 have a clockwise orientation, outlet end 304 and deflection recess 308 have a counter clockwise orientation when viewed from above. Thus, when the plates 110, 112 are in facing relationship, the outlet ends 302, 304 and the deflection recesses 402, 308 are angled in the same direction.

Returning again to FIG. 2, the manifold 213 is shown coupled at a lower outer portion of the upper plate 112 by the fasteners 250. The fasteners 250 can be any mechanism adapted to facilitate easy removal of the manifold 213. Illustratively, the fasteners 250 are a combination of nuts and bolts. Although preferably a separate component, in another embodiment the manifold 213 is an integral feature of the upper plate 112. The manifold 213 is generally an annular member having a lower portion 252 extending below the upper surface 236. In combination, the lower portion 252 and the upper surface 236 define a pocket 253 sized to accommodate a substrate.

Figure 5:
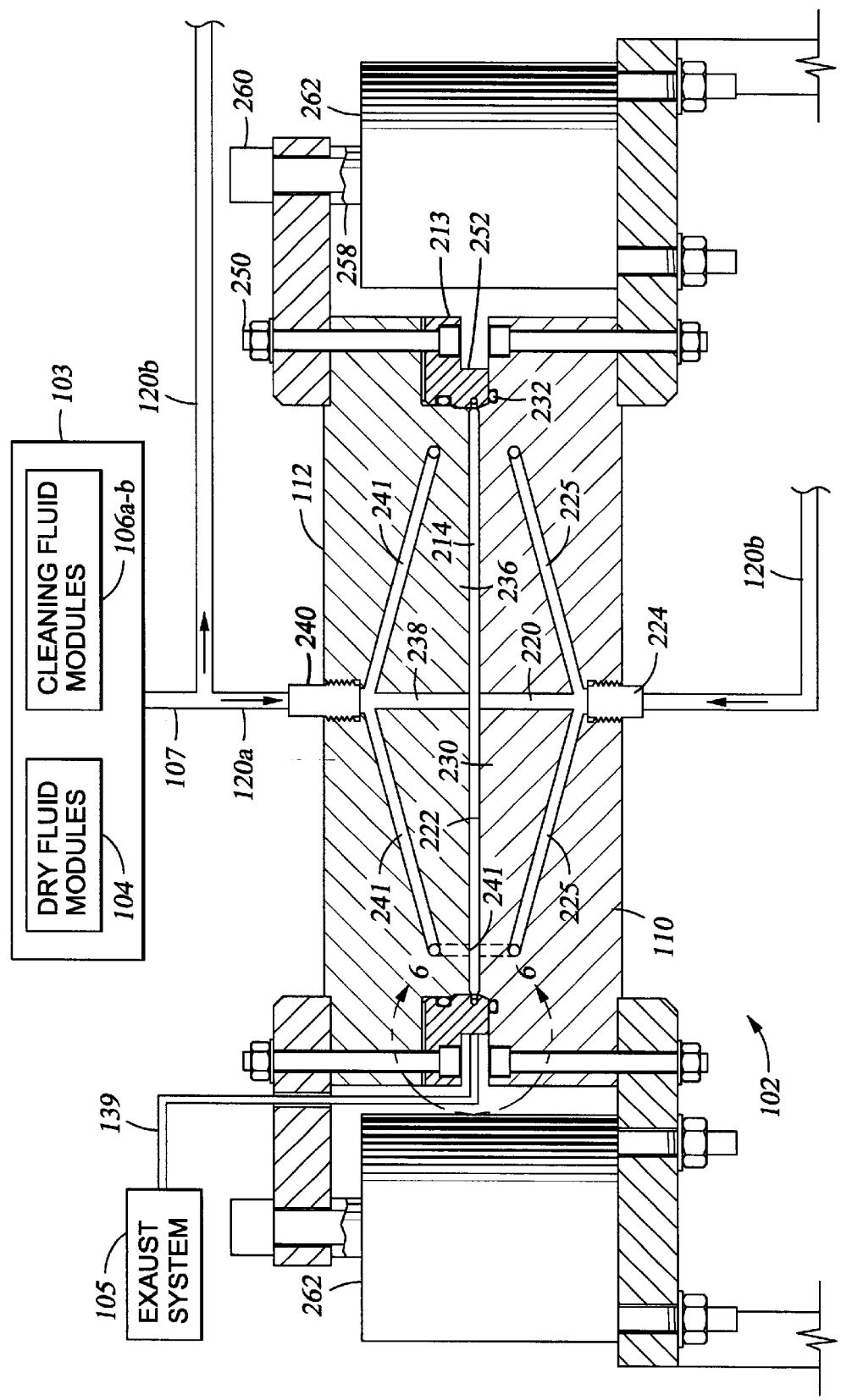
FIG. 5 is a cross section of a cleaning chamber during loading or unloading of a substrate.

FIG. 2 shows the lower plate 110 in a raised/loading position, In such a position, the plates 110, 112 are separated by a space sufficient to allow a robot blade (not shown) to position a substrate between the plates 110, 112. FIG. 5 shows a cross section of the cleaning chamber 102 wherein the upper plate 112 is in a lowered processing position in such a position, a cavity 214 is formed between the upper plate 112 and the lower plate 110. The cavity 214 is generally a disk-shaped gap defined by the upper surface 236, the lower surface 222 and the lower portion 252 of the manifold 213.

Figure 6:
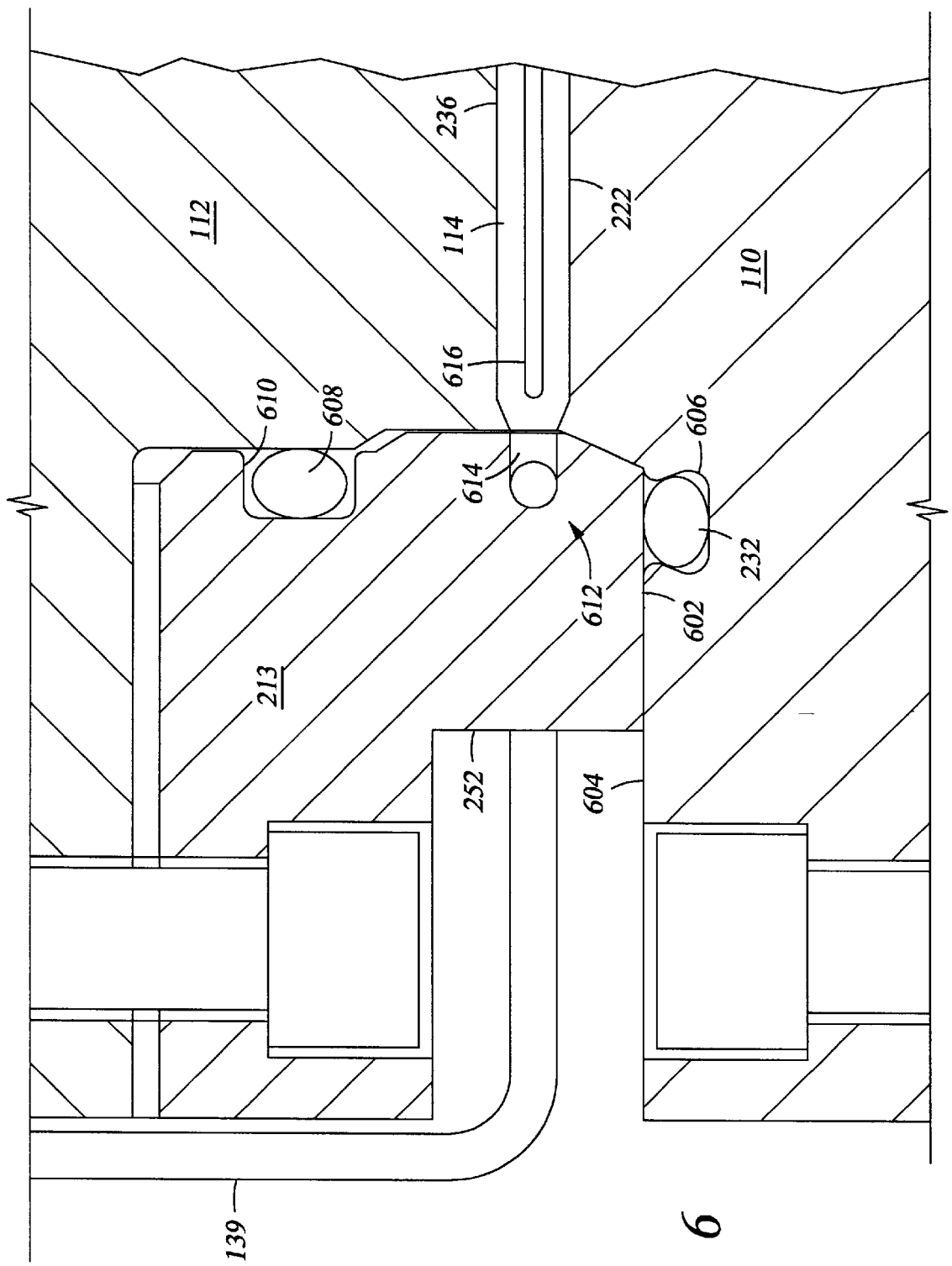
FIG. 6 is a cross section of a cleaning chamber in a processing position.

FIG. 6 shows a detailed view of FIG. 5 taken along the section lines 6—6. A lower surface 602 of the manifold 213 is disposed on a ledge 604 of the lower plate 110. The seal 232 is disposed in a dove-tail groove 606 and is sufficiently compressed by the lower surface 602 to form an annular fluid-tight seal. A second seal 608 is disposed in a grove 610 formed in the manifold 213. Cooperatively, the seals 232 and 608 ensure the fluid-tight integrity of the cavity 114.

An exhaust port 612 is disposed in the manifold 213 and includes a recess 614 formed at an inner diameter of the manifold 213. The recess 614 is formed in the lower portion 252 of the manifold 213 at a height substantially equal to the cavity 114 to allow fluid communication therewith. The port is fluidly coupled to the exhaust line 139 via connecting members such as tubes (described with reference to FIG. 7 below). During processing, a substrate 616 is disposed in the cavity, as will be described in more detail below.

Figure 7:
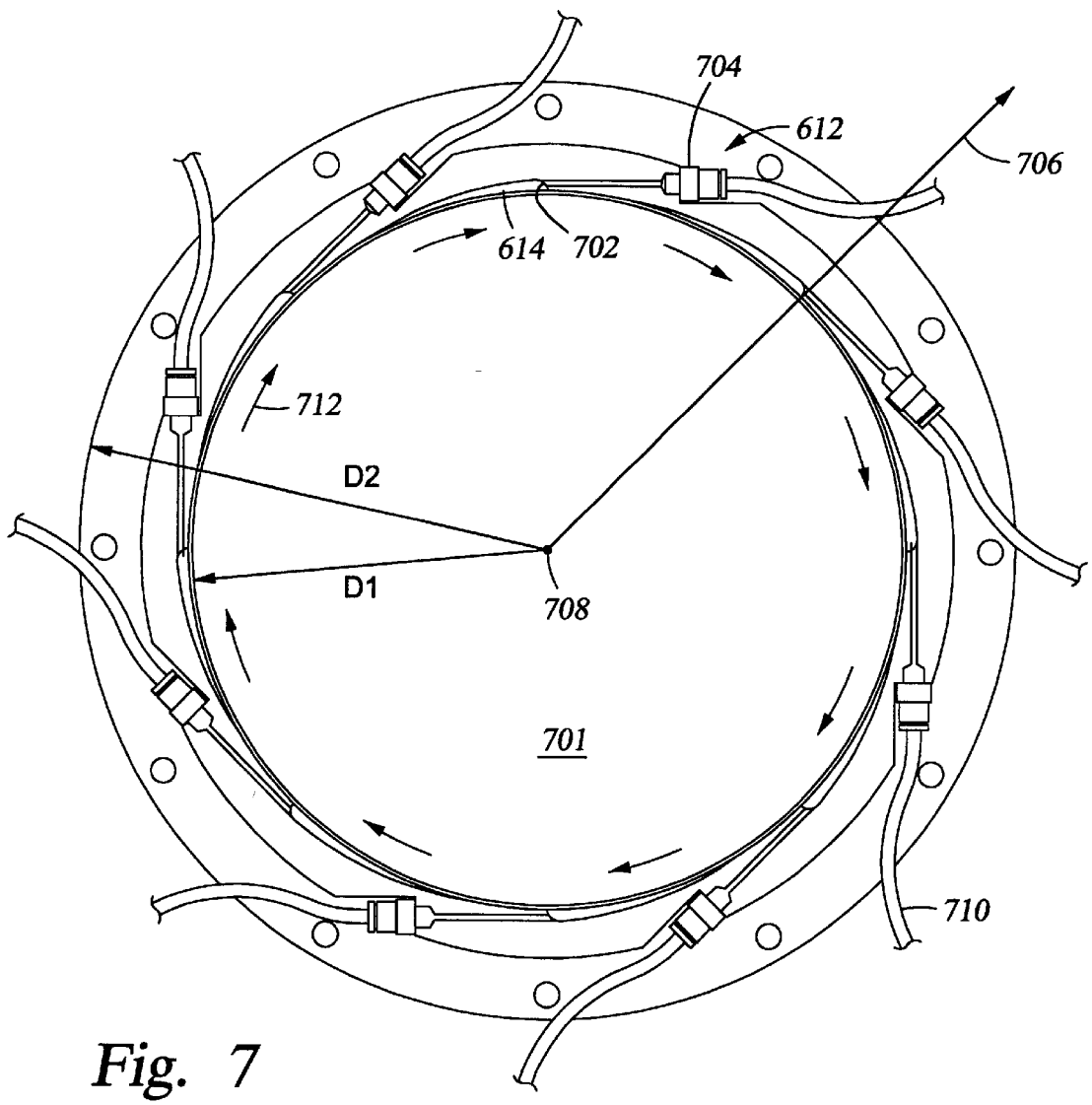
FIG. 7 is a partial cross section view of a cleaning chamber showing flow patterns of fluid.

One embodiment of the manifold 213 and the exhaust ports 612 is shown in FIG. 7 which is taken along the section lines 7—7 of FIG. 2. The manifold 213 is shaped as a ring having an inner diameter D1 and an outer diameter D2 and defines a central opening 701. A plurality of equally spaced ports 612 include an inlet end 702 and outlet end 704. In one embodiment, the inlet end 702 terminates at the recess 614 formed at the inner diameter D1 of the manifold 213. The outlet end 704 is preferably a quick-disconnect connector having a tube 710 coupled thereto. The tubes 710, in turn, are connected to the exhaust line 139 shown in FIGS. 1, 2 and 6.

The orientation of the ports 612 is selected to provide a tangential gas flow from the cavity 114 during processing. Accordingly, the ports 612 are oriented at an angle relative to a radial line 706 originating at a center 708. As will be described in more detail below, gas flowed from the recesses 614 and into the ports 612 provides a rotating flow pattern in the cavity 114.

Figure 8:
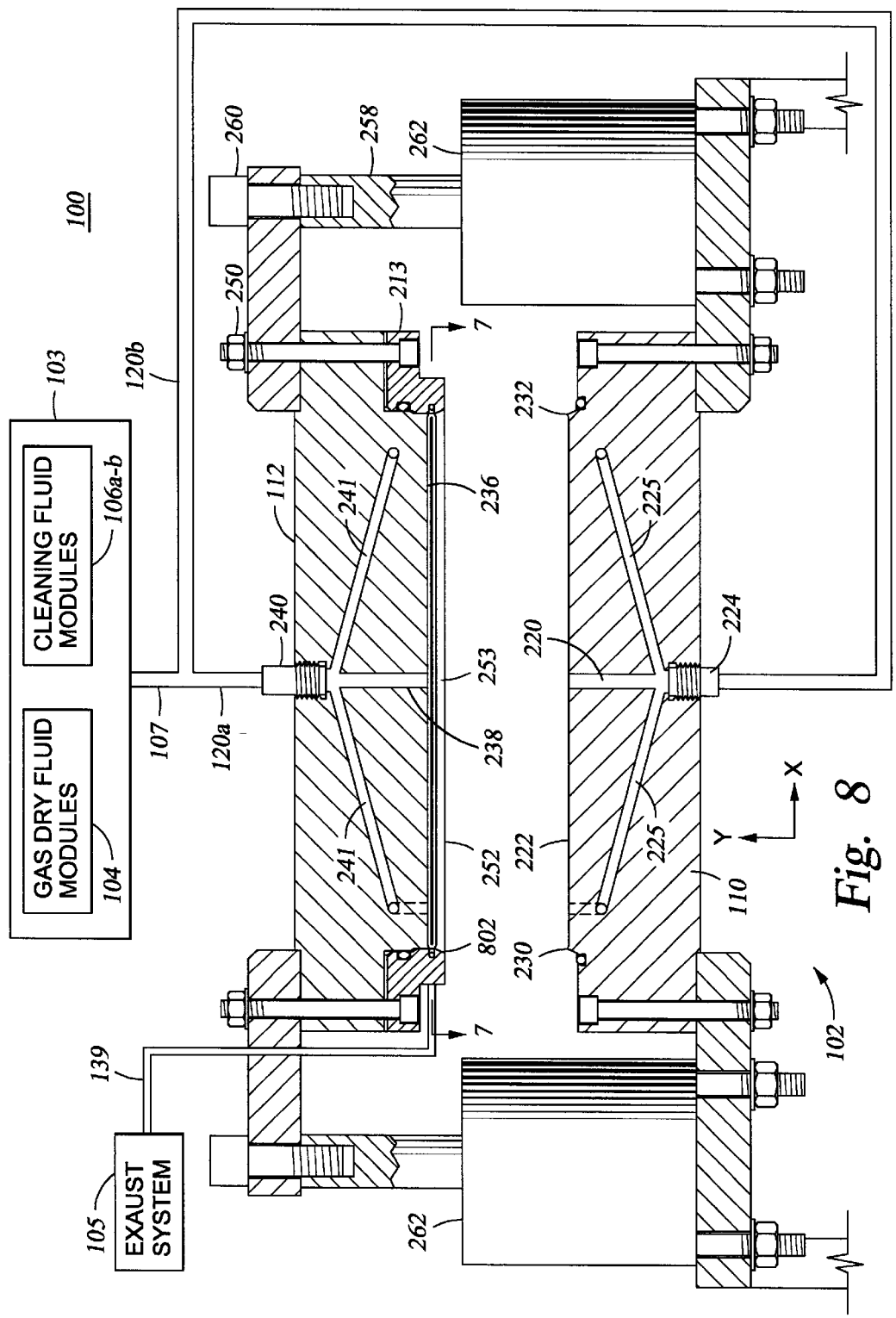
FIG. 8 is a cross section of a cleaning chamber during loading or unloading of a substrate.
Figure 9:
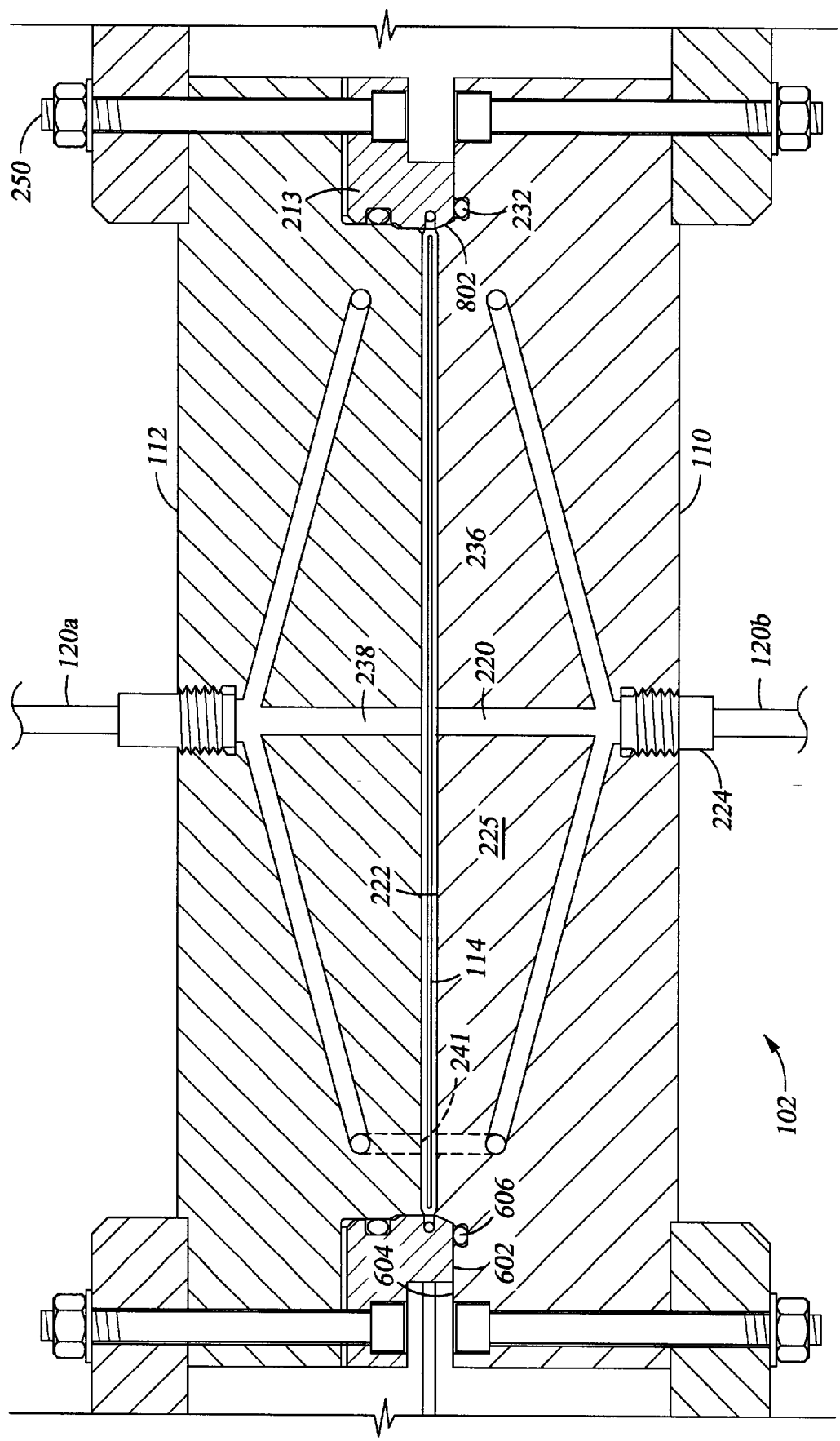
FIG. 9 is a cross section of a cleaning chamber having a substrate disposed therein for processing.

The operation of the cleaning chamber 102 may be understood with reference to FIGS. 8 through 10. Referring first to FIG. 8, the cleaning chamber 102 is shown in a loading position. Specifically, the upper plate 112 has been actuated by actuators 262 to separate the upper plate 112 from the lower plate 110. Plates 110, 112 are separated by distance sufficient to allow a robot blade carrying a substrate 616 to position between the plates 110, 112. The substrate 616 is brought into close proximity with the upper surface 236 and within the pocket 253 defined by the lower portion 252 of the manifold 213 and the upper surface 236. Gas is then flowed from the fluid supply unit 103 through the coupler 240 and along the upper primary channel 238 and upper auxiliary channels 241. The gas travels in the space between the upper surface 236 and the substrate 616 and creates a low pressure region sufficient to lift the substrate 616 from the blade. In addition to creating a low pressure area, the gas flowing in the space between the substrate 616 and the upper surface 236 prevents the substrate from contact the upper surface 236. The resulting Bernoulli effect provides a mechanism for chucking a substrate without substantial contact between the substrate and other components of the cleaning chamber 102.

During the chucking process just described, it may be desirable to align the substrate 616 into the space between the lower portion 252 of the manifold 213. Accordingly, a tapered surface 802 may be provided at the inner diameter of the lower portion 252. As the substrate 616 is lifted into the pocket 253, the edge of the substrate 616 may contact the tapered surface 802. As the substrate 616 continues to move upwardly toward the upper surface 236, the substrate 616 is urged into an aligned position relative to the pocket 253 of the upper plate 112.

Once the substrate 616 is chucked to the upper plate 112, the actuators 262 lower the upper plate 112 into the position shown in FIG. 9. Thus, the bottom surface 602 of the manifold 213 is seated on the ledge 604 and is in abutment with the seal 606.

At some time prior to sealing the cleaning chamber 102, the exhaust unit 105 is activated. The exhaust unit 105 provides a negative pressure to exhaust the processing cavity 114 via the ports 612 of the manifold 213. Once the substrate is enclosed within the processing cavity 114 of the cleaning chamber 102 in the manner shown in FIG. 9, the substrate 616 may be processed according to various recipes and methods. During a cleaning step, one or more fluids are flowed from one or more of the modules 106a–d of the fluid supply unit 103 to the processing cavity 114 via one or both of the plates 110, 112. As will described below with reference to FIG. 13, the invention contemplates processing one side or both sides of a substrate. In either case, the substrate is maintained in a spaced relationship with the surfaces defining the processing cavity 114. Accordingly, the processing cavity 114 provides a substantially contactless processing environment for the substrate.

FIG. 10 is a partial cross sectional view of the cleaning chamber 102 and illustrates the flow pattern (shown by arrows) of fluid over the substrate 616. The location of the primary channels 220, 238 allows the fluids to be delivered to a central portion 1004 of the substrate 616. Thus, fluid is flowed substantially uniformly over an upper surface 1006 and a lower surface 1008 of the substrate 616. As a result of fluid flow from the deflection recesses 402, the substrate 616 is caused to rotate. Specifically, the angled orientation of the outlet ends 302 and the deflection recesses 402 provide a substantial tangential velocity component to the fluid relative to the substrate surface. The friction between the fluid and the substrate 616 causes the momentum of the fluid to be transferred to the substrate 616. As a result, a torque is exerted on the substrate 616 causing rotation about a central axis A of the cleaning chamber 102. In general, the rotational velocity of the substrate 616 may be controlled by adjusting the flow rate of the fluids from the deflection recesses 402. In one embodiment, the substrate 616 is rotated at between about 2000 rpm and about 3000 rmp.

The substrate rotation is further controlled by fluid flow into the ports 612 of the manifold 213. Referring briefly to FIG. 7, the direction of fluid flow proximate the ports 612 is shown by arrows 712. Fluid flow into the ports 612 induces a tangential flow pattern in the processing cavity 114 at the edge of the substrate 616. Accordingly, the velocity of fluid flowing into the ports 612 may also be adjusted to control rotation of the substrate 616.

Rotation of the substrate 616, achieves a washing action whereby fluid flow is provided over all surfaces of the substrate 616 with minimal potential for "dead" areas where fluid flow is stagnant. As the fluid continues to flow over the surface of the substrate 616, particulate is flushed therefrom. The fluid carries the particulate outwardly toward and over the edge of the substrate. The fluid is then expelled from the process cavity 114 through the ports 612.

Following a cleaning cycle, the substrate 616 may be dried by flowing a drying agent from the drying fluid module 104 of the fluid supply unit 103 through the primary channels 220, 238 and the auxiliary channels 225, 241. Illustrative cleaning and drying processes will be described below with reference to FIG. 13.

Subsequent to the cleaning and drying processes, the chamber is returned to the position shown in FIG. 8 by raising the upper plate 112 under the action of the actuators 262. The substrate 616 remains chucked to the upper plate 112 by the continuing flow of gas from the fluid supply unit 103 to the upper primary channel 238 and the upper auxiliary channels 241. The robot blade is then inserted into a position below the substrate 616. The substrate 616 is positioned on a blade by terminating the gas flow from the fluid supply unit 103. Once positioned on the blade, the substrate 616 is removed from the cleaning chamber 102 by retracting the blade through the slit valve door opening. The substrate 616 may then be transferred to other chambers for additional processing or may be packaged for shipment in the case of a finished product.

Figure 11:
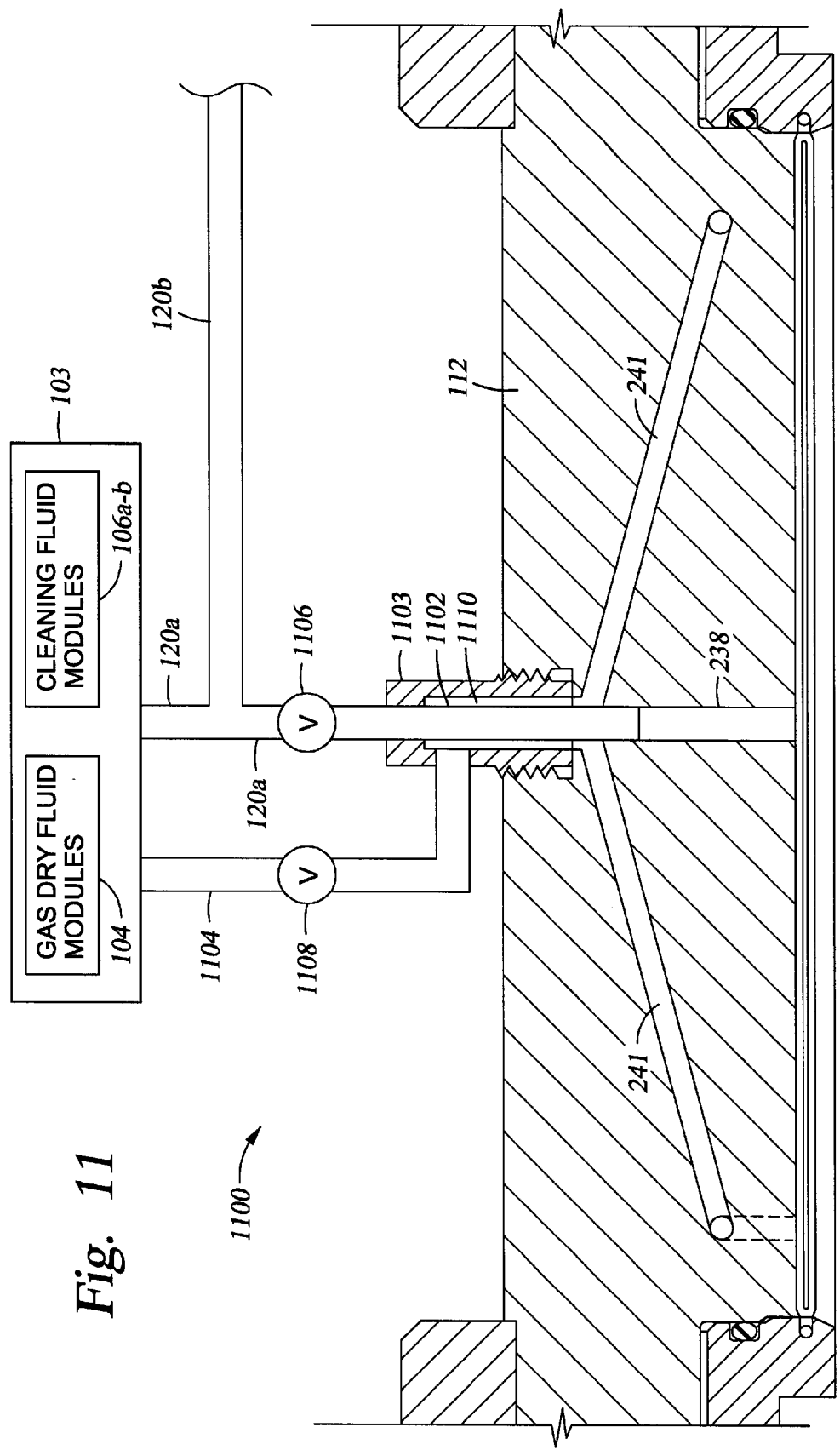
FIG. 11 is an alternative embodiment of a processing system.

In the foregoing operational description, the substrate 616 is chucked in a contactless manner, i.e., in a manner wherein substrate 616 does not contact either the upper or lower portions of the chamber body, by flowing fluids from both the upper primary channel 238 and upper auxiliary channels 241, as well as lower primary channel 220 and lower auxiliary channel 225. As a result of flow through the auxiliary channels 241, some rotation may be imparted to the substrate 616. However, in another embodiment the primary and auxiliary channels 238, 241 are individually valved. Accordingly, fluid flow though the channels 238, 241 may be separately controlled. One such embodiment is illustrated in FIG. 11. In order to maintain isolated flow paths, a tube 1102 is concentrically disposed in a coupler 1103 to connect the inlet line 120a to the upper primary channel 238. Another inlet line 1104 connects the fluid supply unit 103 to the coupler 1103. A concentric passageway defined between the coupler 1103 and the tube 1102 provides fluid communication between the fluid supply unit 103 and the upper auxiliary channels 241. Independently operable valves 1106, 1108 are disposed in each of the inlet lines 120a and 1104. In operation, a first valve 1106 is opened to allow fluid flow from the fluid supply unit 103 to the upper primary channel 238, thereby providing a pressure region sufficient to chuck a substrate. Once the upper plate 112 is lowered to seal the processing chamber 114, a second valve 1108 can be opened to allow fluid flow from the fluid supply unit 103 to the upper auxiliary channels 241 and cause the rotation of the substrate. In another embodiment, the lower primary channel 220 and lower auxiliary channels 225 may be similarly valved.

Figure 12:
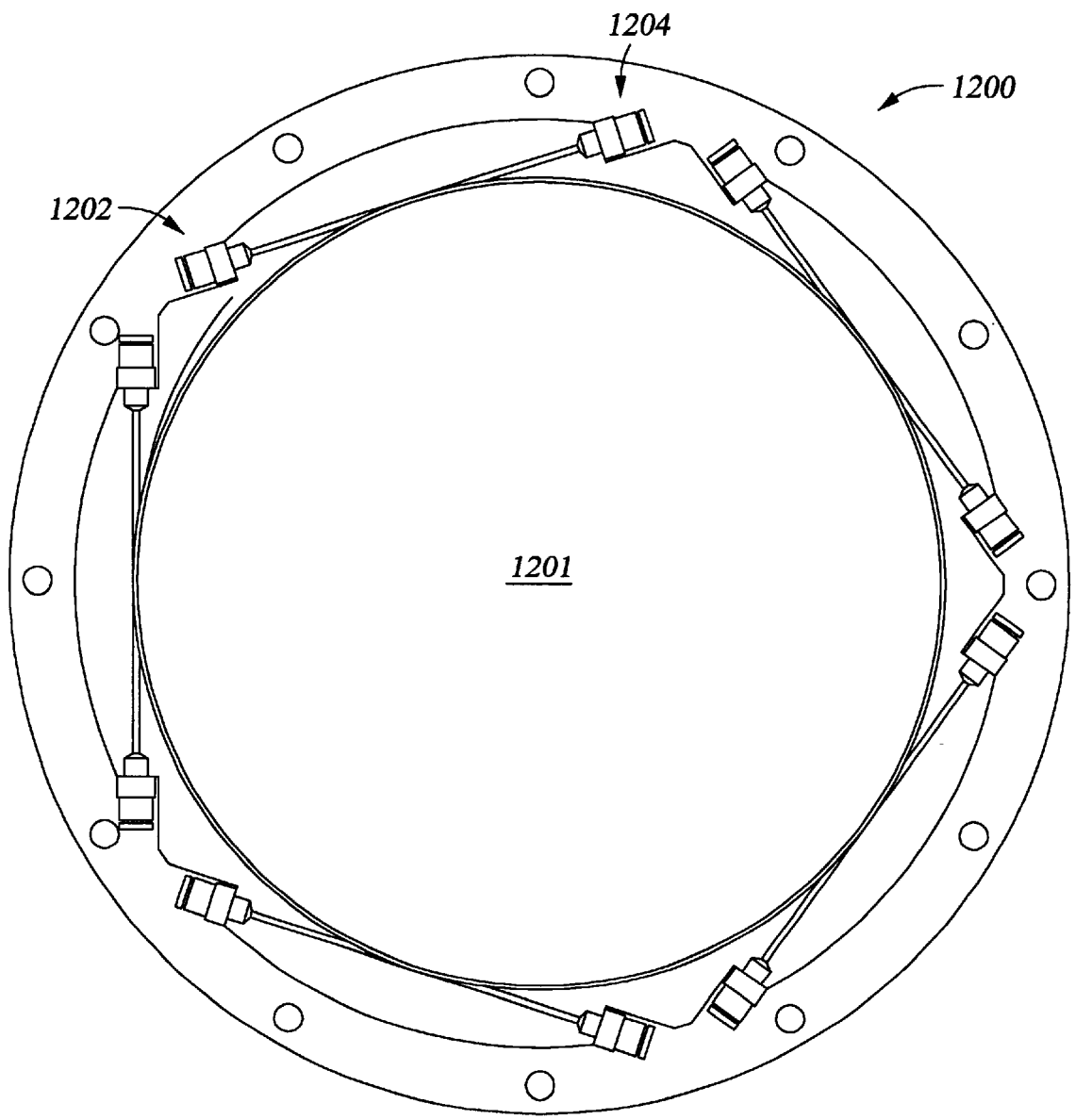
FIG. 12 is an alternative embodiment of a manifold.

In another embodiment, the manifold 213 may include counter-oriented ports. FIG. 12 shows a manifold 1200 defining an opening 1201 (substantially defining the processing cavity 114). The manifold 1200 has a first plurality of ports 1202 oriented in a first tangential direction and a second plurality of ports 1204 oriented in a second tangential direction. In one embodiment, the first plurality of ports 1202 provides an inlet for fluids into the processing cavity 114 and the second plurality of ports 1204 provides an outlet/exhaust for fluids from the processing cavity 114. Such an arrangement is believed to allow for greater angular velocity of a substrate being processed than can be achieved with the manifold 213. In another embodiment, both the first and the second plurality of ports 1202, 1204 are adapted to flow fluids into the processing chamber 102. In such an arrangement, fluid flow from the first plurality of ports 1202 may cause rotation of the substrate during cleaning and fluid flow from the second plurality of ports 1204 may halt the rotation at the end of the cleaning cycle. In yet another embodiment, the ports may be valved to accommodate switching between fluid flow into the processing region and exhausting fluid flow from the processing region. Thus, rotation of a substrate is accomplished by simultaneously flowing fluid from the first plurality of ports 1202 and into the second plurality of ports 1204. At the end of the cleaning cycle, the substrate rotation is halted by reversing the fluid flow through the ports 1202, 1204 such that fluid is flowed into the first plurality of ports 1202 and from the second plurality of ports 1202.

Figure 13:
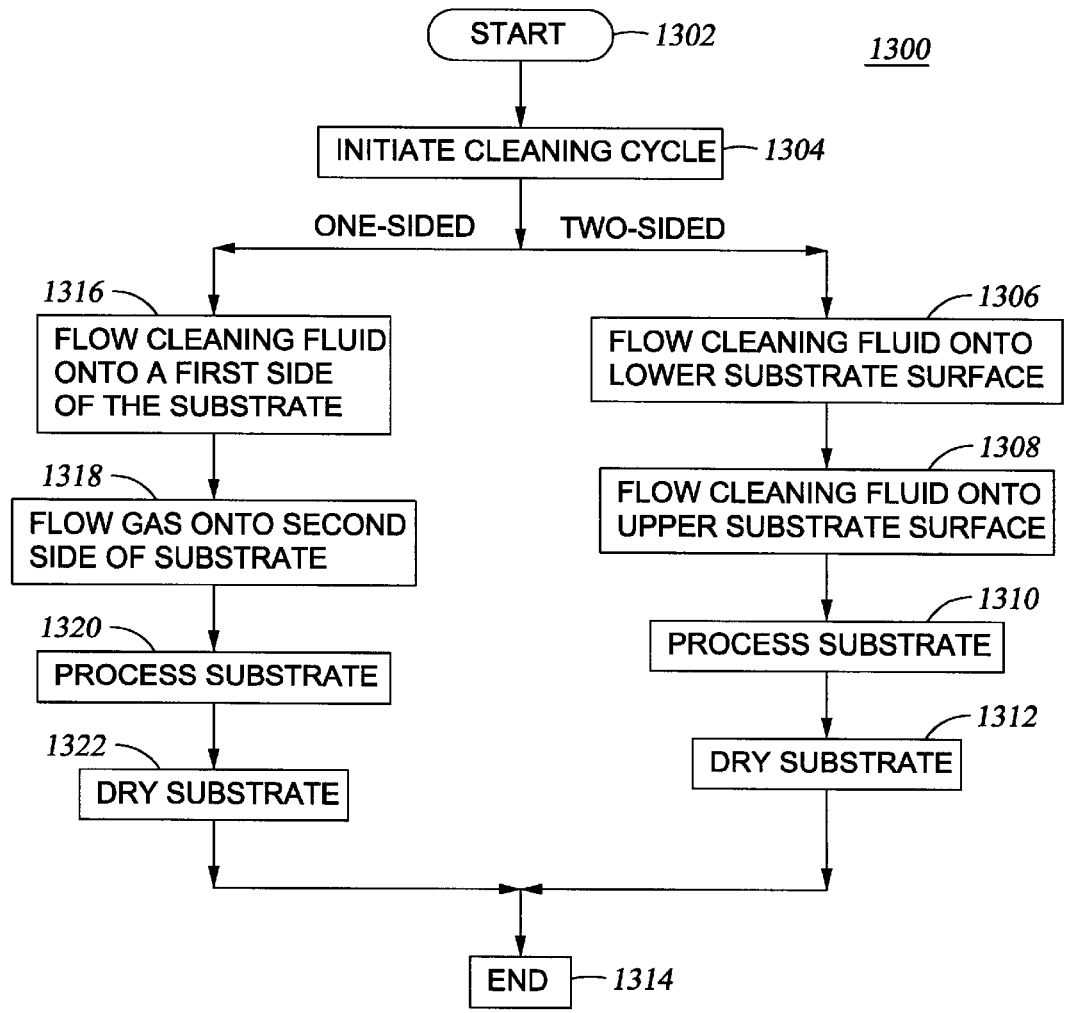
FIG. 13 is a flow diagram illustrating a one-sided and two-sided cleaning process.

The invention contemplates various recipes and methods to process a substrate in the cleaning chamber 102. Illustrative methods are described with reference to FIG. 13. FIG. 13 shows a method 1300 which provides for a two-sided (i.e., upper and lower surfaces of a substrate simultaneously) clean/dry process and a one-sided (i.e., either the upper or the lower surfaces of a substrate) clean/dry process. The method 1300 begins at step 1302 where the substrate is loaded into the processing cavity 114 and the exhaust unit 105 is activated to evacuate the processing cavity 114 via the ports 612 of the manifold 213. At step 1304, one or more cleaning fluids are flowed from one of the modules 106a–d of the fluid supply unit 103 to the processing cavity 114. In a two sided cleaning process, cleaning fluid is flowed to the lower surface of the substrate 616 via the lower primary channel 220 and lower auxiliary channels 225, at step 1306, thereby providing a pressure to the lower surface of the substrate 616. At step 1308, cleaning fluid is flowed from the module 106a–d to the upper primary and auxiliary channels 238, 241 and then over the upper surface of the substrate 616. Preferably, steps 1306 and 1308 are preformed substantially simultaneously in order to maintain the substrate at positional equilibrium and minimize the potential for perturbations which could cause contact between the substrate and surrounding surfaces. Following step 1308, the substrate 616 is substantially immersed in a bath of cleaning fluid. At step 1310, the substrate 616 is processed for a period of time in an environment of cleaning fluids to clean both sides of a substrate.

At step 1312, the substrate is dried. In one embodiment, the flow of cleaning fluids is ceased and a drying agent is brought into contact with the substrate 616. The drying agent may be provided from the drying fluid module 104 of the fluid supply unit 103 while the substrate 616 continues to rotate. The exhaust unit 105 continues to operate to exhaust the drying agent from the processing cavity 114. The transition between flowing cleaning fluids and drying agents may be made by controlling a combination of the valves 126, 134 of the fluid supply unit 103. In a two-sided cleaning process, the drying agent is allowed to contact all surfaces of the substrate by flowing the drying agent through the primary channels 220, 238 as well as through the auxiliary channels 225, 241.

Step 1312 may further include terminating the flow of the drying agent to the substrate and supplying a gas to the processing cavity 114. Accordingly, any residual fluid is flowed from the cavity 114 into the ports 614 of the manifold 213. The drying of the substrate may be further facilitated by evaporation of the fluids.

In one embodiment, a Marangoni drying process is used to dry the substrate. Marangoni drying is a process whereby surface tension-reducing volatile organic compounds (VOC's) are passively introduced (by natural evaporation and diffusion of vapors) in the vicinity of the meniscus of a thin film of liquid adhering to a substrate in motion relative to the liquid. The introduction of the VOC's results in surface tension gradients which cause the liquid film to flow off of the substrate, leaving it dry. In one embodiment, the VOC is an $IPA/N_2$ mixture.

For a one sided cleaning process, the method 1300 proceeds from step 1302 to step 1316, where a cleaning fluid is flowed on a first side of a substrate. For example, an upper side of a substrate may be cleaned by flowing cleaning fluids through the upper primary channel 238 and upper auxiliary channels 241. At step 1318, a gas is flowed onto the second side of the substrate, i.e., the side not being cleaned. Thus, where the upper substrate surface is being cleaned, a gas is flowed through the auxiliary channels 225 and/or the lower primary channel 220. Flowing a gas onto the substrate surface not being cleaned provides a gas barrier which acts to prevent the cleaning fluid from flowing onto the surface while also providing an air cushion to prevent contact between the substrate and chamber components. Preferably, step 1318 is performed simultaneously with step 1316 or slightly prior thereto. At step 1320, the substrate is processed for a period of time.

At step 1324 the substrate is dried. In a one-sided cleaning process, the drying agent is flowed onto the surface of the substrate which has just been cleaned. A gas continues to be provided to the other side of the substrate 616 in order to maintain the contactless condition within the processing cavity 114. The method 1300 is exited at step 1314 at which point the substrate may be removed from the cleaning chamber 102.

In one embodiment, the cleaning process may include cleaning a first side of the substance and subsequently cleaning the second side of the substrate. Thus, with reference to method 1300 of FIG. 13, steps 1316, 1318, 1320 and 1324 may be repeated for each side of the substrate. Other embodiments contemplated by the invention will be recognized by those skilled in the art.

While the foregoing is directed to the preferred embodiment of the present invention, other and further embodiments of the invention may be devised without departing from basic scope thereof, and the scope thereof is determined by the claims that follow.

What is claimed is:
1. A substrate cleaning chamber comprising:
  a) a chamber body having an upper surface and a lower surface cooperatively defining a processing cavity adapted to accommodate a substrate;
  b) a first fluid inlet formed in the chamber body terminating at the upper surface and being in fluid communication with the processing cavity;
  c) a second fluid inlet formed in the chamber body terminating at the lower surface and being in fluid communication with the processing cavity; and
  d) one or more evacuation ports disposed about the processing cavity at a radial distance from a center axis of the processing cavity, wherein each of the one or more evacuation ports comprises an inlet and an outlet oriented at an angle relative to a radial line originating at the center axis.

2. The apparatus of claim 1, wherein the one or more evacuation ports are configured to provide a tangential flow of fluids away from the processing cavity.

3. The apparatus of claim 1, wherein the one or more evacuation ports are radially disposed at points substantially equal to the diameter of the processing cavity.

4. The apparatus of claim 1, wherein the first fluid inlet and the second fluid inlet are disposed along the central axis.

5. The apparatus of claim 1, wherein the chamber body further comprises an upper surface and a lower surface defining an upper boundary and a lower boundary of the processing cavity, respectively, wherein the first fluid inlet terminates proximate the center axis of the processing cavity on the upper surface.

6. The apparatus of claim 1, further comprising a first plurality of propulsion channels formed in the chamber body and terminating at the upper surface, wherein at least a portion of the first plurality of propulsion channels are disposed at one of a clockwise and counterclockwise angle relative to the center axis.

7. The apparatus of claim 1, further comprising a first plurality of propulsion channels formed in the chamber body and terminating at the upper surface, wherein at least a portion of the first plurality of propulsion channels are disposed at an angle relative to a radial line originating at the center axis.

8. The apparatus of claim 7, wherein the first plurality of propulsion channels are configured to flow a fluid into the processing cavity at an angle relative to the radial line.

9. The apparatus of claim 7, further comprising a fluid supply coupled to the first and second fluid inlets and to the first plurality of propulsion channels.

10. The apparatus of claim 7, further comprising a second plurality of propulsion channels formed in the chamber body and terminating at the lower surface, wherein at least a portion of the second plurality of propulsion channels are disposed at an angle relative to a plane of the lower surface.

11. The apparatus of claim 10, wherein the first plurality of propulsion channels and the second plurality of propulsion channels include outlet portions oriented in a common direction to provide an annular flow pattern in the processing cavity when a fluid is flowed through the outlet portions.

12. The apparatus of claim 1, further comprising a gas supply and a liquid supply coupled to the first and second fluid inlets.

13. The apparatus of claim 1, wherein the chamber body further comprises an upper plate having the upper surface disposed thereon and a lower plate having the lower surface disposed thereon, wherein the upper surface and lower surface are in substantial parallel relation.

14. The apparatus of claim 13, further comprising an actuator coupled to at least one of the upper plate or lower plate to enable vertical motion of the plates.

15. The apparatus of claim 1, further comprising a manifold disposed in the chamber body having the one or more evacuation ports formed therein.

16. The apparatus of claim 15, wherein the manifold is coupled to the upper plate.

17. The apparatus of claim 15, wherein recesses are formed in the manifold at each inlet of the one or more evacuation ports.

18. A substrate cleaning chamber comprising:
  a) a chamber body having an upper plate with an upper surface formed thereon and lower plate having a lower surface formed thereon, wherein the upper surface and the lower surface cooperatively define a processing cavity therebetween;

b) a first fluid inlet formed in the chamber body and terminating at the upper surface;

c) a second fluid inlet formed in the chamber body and terminating at the lower surface, wherein the first fluid inlet and the second fluid inlet are disposed along a center axis of the processing cavity;

d) a first plurality of propulsion channels terminating on the upper surface at a radial distance from the center axis;

e) a second plurality of propulsion channels terminating on the lower surface and at a radial distance from the center axis; and f) one or more evacuation ports disposed about the processing cavity at a radial distance from the center axis, wherein each of the one or more evacuation ports comprises an inlet and an outlet oriented at an angle relative to a radial line originating at the center axis, and wherein at least one of the first plurality of propulsion channels and the second plurality of propulsion channels are configured to impart rotational motion to a substrate positioned within the processing cavity.

19. The apparatus of claim 18, further comprising an actuator coupled to at least one of the upper plate and the lower plate.

20. The apparatus of claim 18, wherein at least one of the one or more evacuation ports are oriented to provide a tangential flow of gas from the processing cavity.

21. The apparatus of claim 18, wherein the first plurality of propulsion channels and the second plurality of propulsion channels include outlet portions oriented in a common direction to cooperatively provide an annular flow pattern in the processing cavity when a fluid is flowed through the respective outlet portions.

22. The apparatus of claim 18, wherein at least a portion of first and second plurality of propulsion channels are disposed at one of a clockwise and counterclockwise angle relative to the center axis.

23. The apparatus of claim 18, wherein the first and second plurality of propulsion channels are disposed to flow a fluid into the processing cavity at an angle to a radial line originating at the center axis.

24. The apparatus of claim 23, further comprising a fluid supply coupled to the first and second fluid inlets and to the first plurality of propulsion channels.

25. The apparatus of claim 18, further comprising a manifold disposed in the chamber body having the one or more gas evacuation ports formed therein.

26. The apparatus of claim 25, wherein the manifold is coupled to the upper plate.

27. The apparatus of claim 18, further comprising a fluid delivery system coupled to the first and second fluid inlets and to the first plurality of propulsion channels.

28. The apparatus of claim 27, further comprising a vacuum unit coupled to the one or more evacuation ports.

29. A processing system comprising:
a) a transfer chamber; and
b) at least one substrate cleaning chamber comprising:
   i) a chamber body defining a processing cavity adapted to accommodate a substrate and further defining an opening to accommodate transfer of a substrate from the transfer chamber into the processing cavity;
   ii) a first fluid inlet formed in the chamber body and in fluid communication with the processing cavity, the first fluid inlet being positioned about a center axis of the processing cavity;
   iii) a plurality of fluid propulsion channels terminating within the processing cavity, the plurality of fluid propulsion channels being configured to generate a fluid flow in an annular pattern; and
   iv) one or more gas evacuation ports disposed about the processing cavity at a radial distance from the center axis of the processing cavity, wherein each of the one or more evacuation ports comprises an inlet and an outlet oriented at an angle relative to a radial line originating at the center axis.

30. The system of claim 29, further comprising a manifold disposed in the chamber body and having the one or more gas evacuation ports formed therein.

31. The system of claim 29, further comprising a gas supply coupled to the fluid inlet and a liquid supply coupled to the first fluid inlet.

32. The system of claim 29, further comprising a robot disposed in the transfer chamber and adapted transfer substrates into the cleaning chamber.

33. The system of claim 29, further comprising a liquid source coupled to the fluid inlet.

34. The system of claim 29, wherein the one or more of the gas evacuation ports are oriented to provide a tangential flow of gas from the processing cavity.

35. The system of claim 29, wherein the plurality of propulsion channels further comprise a first plurality of fluid propulsion channels terminating at an upper surface of the processing cavity and a second plurality of fluid propulsion channels terminating at a lower surface of the processing cavity.

36. The system of claim 35, wherein the plurality of first propulsion channels are disposed to flow a fluid into the processing cavity at an angle to a radial line originating at the center axis.

37. The system of claim 35, further comprising a fluid supply in communication with the plurality of propulsion first channels.

38. The system of claim 35, wherein at least a portion of the plurality of second propulsion channels are disposed at an angle relative to the radial line.

39. The system of claim 38, wherein the first plurality of propulsion channels and the second plurality of propulsion channels include outlet portions oriented in a common direction to provide an annular flow pattern in the processing cavity when a fluid is flowed through the respective outlet portions.

40. The system of claim 29, further comprising a manifold disposed in the chamber body and having the one or more gas evacuation ports formed therein.

41. The system of claim 40, wherein the manifold is an annular member coupled to an upper plate of the chamber body.

42. The system of claim 29, wherein the chamber body comprises an upper plate and a lower plate in substantial parallel relation to each other and defining at least a portion of the processing cavity.

43. The system of claim 42, wherein the first fluid inlet is disposed in the upper plate and a second fluid inlet is disposed in the lower plate.

44. The system of claim 42, wherein the second fluid inlet are disposed along the center axis.

45. A method for cleaning a substrate, comprising:
a) providing a chamber body having a processing cavity therein that is at least partially defined by an upper surface and lower surface of the chamber body;
b) positioning a substrate in the processing cavity;
c) flowing a first fluid into the processing cavity and onto the substrate;

d) flowing a second fluid into the processing cavity onto the substrate an angle to cause rotation of the substrate about a center axis, wherein the flow of the first and second fluids is configured to maintain the substrate in the processing cavity in a contactless manner; and e) exhausting the first and second fluids tangentially away from the processing cavity through evacuation ports disposed about the substrate.

46. The method of claim 45, wherein c) comprises flowing the first fluid from one or more channels formed in at least one of the upper and lower surface.

47. The method of claim 45, wherein c) comprises flowing the first fluid from a first channel formed in the upper surface and a second channel formed in the lower surface, wherein the first and second channels are disposed along a center axis of the cavity.

48. The method of claim 45, wherein c) comprises flowing the first fluid from a central portion of the substrate radially outward toward an edge of the substrate.

49. The method of claim 45, wherein d) comprises flowing the second fluid at an angle to a radial line originating at a center of the substrate.

50. The method of claim 45, wherein d) comprises providing a torque to the substrate.

51. The method of claim 45, wherein c) comprises flowing the first fluid from a central portion of the substrate radially outward toward an edge of the substrate and wherein d) comprises flowing the second fluid at an angle to a radial line originating at a center of the substrate.

52. The method of claim 45, wherein d) comprises flowing a fluid from outlets formed in one of the upper and lower surfaces.

53. The method of claim 45, wherein d) comprises flowing the fluid into a space formed between an upper surface of the substrate and the upper surface.

54. The method of claim 53, wherein flowing the fluid into the space comprises flowing the fluid from a channel formed in the upper surfaces.

55. The method of claim 45, wherein b) comprises:
positioning the substrate between the upper surface and the lower surface; and
creating a low pressure in the space between the substrate and the upper surface to suspend the substrate.

56. The method of claim 55, wherein b) further comprises actuating at least one of the upper and lower surfaces toward the other of the upper and lower surface.

* * * * *

UNITED STATES PATENT AND TRADEMARK OFFICE
CERTIFICATE OF CORRECTION

PATENT NO. : 6,589,361 B2
DATED : July 8, 2003
INVENTOR(S) : Luscher et al.

It is certified that error appears in the above-identified patent and that said Letters Patent is hereby corrected as shown below:

Title page,
Item [56], References Cited, OTHER PUBLICATIONS, please insert
-- PCT Search Report dated Oct. 9, 2001 for PCT/US01/19121 --.

Column 4,
Line 53, please change "24b" to -- 124b --.

Column 7,
Line 9, please change "positition in" to -- position. In --

Signed and Sealed this

Eleventh Day of May, 2004

JON W. DUDAS
*Acting Director of the United States Patent and Trademark Office*